Figure 1:
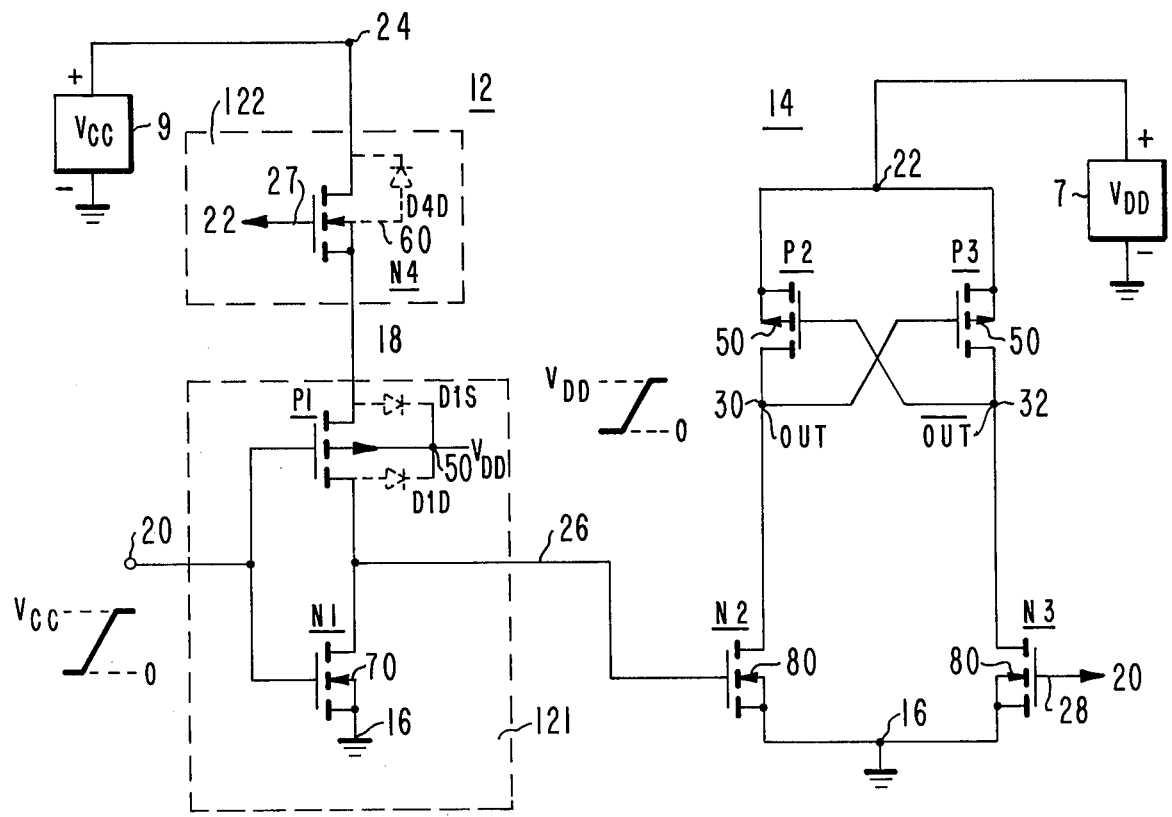

United States Patent [19]

Goldman et al.

[11] 4,039,869
[45] Aug. 2, 1977

[54] PROTECTION CIRCUIT

[75] Inventors: Michael Barnett Goldman, Belle Mead; Stanley Joseph Niemiec, Somerville, both of N.J.

[73] Assignee: RCA Corporation, New York, N.Y.

[21] Appl. No.: 636,093

[22] Filed: Nov. 28, 1975

[51] Int. Cl.² .................... H01L 29/78; H03K 17/60; H03K 17/30; H03K 3/353
[52] U.S. Cl. ................................. 307/304; 307/251; 307/279; 307/DIG. 1; 357/42
[58] Field of Search ................. 307/202, 304, DIG. 1, 307/251, 255, 279, 288; 357/41, 42; 330/307 P

[56] References Cited
U.S. PATENT DOCUMENTS

| 3,675,144 | 7/1972 | Zuk | 307/205 X |
| 3,676,700 | 7/1972 | Buchanan | 307/205 |
| 3,754,171 | 8/1973 | Anzai et al. | 307/304 X |
| 3,801,831 | 4/1974 | Dame | 307/304 X |
| 3,866,064 | 2/1975 | Gregory et al. | 307/304 X |
| 3,916,430 | 10/1975 | Heuner et al. | 307/304 X |

Primary Examiner—John S. Heyman
Assistant Examiner—Larry N. Anagnos
Attorney, Agent, or Firm—H. Christoffersen; Henry I. Schanzer

[57] ABSTRACT

A protection circuit for a monolithic integrated circuit in which regions of one conductivity type are formed in a common substrate of complementary conductivity type and in which a first voltage is applied to the substrate to prevent forward conduction through the junctions formed between the regions and the substrate. The protection network includes a control element, responsive to the first voltage, which is connected between a second voltage point and selected regions for coupling the voltage at the second point to the selected regions only in response to the presence of the first voltage. This prevents the junctions formed by the selected regions and the substrate from being forward biased and carrying excessive and/or destructive currents when the first voltage is absent.

11 Claims, 2 Drawing Figures

PROTECTION CIRCUIT

This invention relates to a protection network for a monolithic integrated circuit (IC) having different portions operated at different voltage levels.

IC's containing field effect transistors (FETs) include regions of one conductivity (e.g., P) type formed in or on a substrate of complementary conductivity type (e.g., N). A FET may be formed by means of two adjacent diffused regions defining the ends of a conduction channel and a control electrode overlying the channel for controlling its conductivity. At the interfaces between the diffused regions and the substrate, PN junctions are formed. To prevent parasitic diode action between the diffused regions and the substrate, a voltage is applied to the substrate of sufficient magnitude and polarity to reverse bias the PN junctions for all values of signals and operating voltage normally applied to the diffused regions.

A problem exists when different portions of the monolithic integrated circuit are operated at different voltages. For example, where P-conductivity type regions are diffused in an N-conductivity type substrate, some diffused regions may be operated at a first voltage $V_1$ (e.g., 15 volts) and selected diffused regions may be operated at a second, lower voltage $V_2$ (e.g., 5 volts). The first higher, voltage is also applied to the N-substrate to ensure that none of the PN junctions conducts in the forward direction.

If $V_1$ is absent (e.g., is ground) when $V_2$ is applied to the circuit, the PN junctions, to which $V_2$ is applied, become forward biased and current flows from the $V_2$ power supply, through the PN junctions into the grounded substrate. Since the resistance of the junctions in the forward direction is very low (e.g., of the order of ohms), excessively high currents flow resulting in the burn-out of the junctions, destruction of the circuit and, possibly, damage to the power supply.

Hence, when two or more power supplies are used to supply the different operating voltage, the power supplies must be sequenced. The power source supplying the substrate voltage must be turned on prior to the turn on of the source supplying the operating voltage to the selected diffused regions; and the voltage applied to the diffused regions must be removed prior to the removal of the substrate voltage. If this sequence is not followed, the circuit may be destroyed. In circuits embodying the invention, the need to sequence the power supplies is eliminated.

An integrated circuit embodying the invention includes a substrate of one conductivity type to which is applied a first voltage, and at least one region of complementary conductivity type, in physical contact with the substrate, to which a second, different voltage is applied by means of control means responsive to the first voltage. The control means includes a control element having a conduction path, connected between the region and a second voltage point, and a control electrode to which is applied the first voltage also applied to the substrate. The first voltage applied to the substrate is of a polarity and magnitude to, normally, reverse bias the junction formed between the region and the substrate. The second voltage is of a polarity to forward bias the junction. The control means, responsive to the first voltage, allows the application of only as much of the second voltage to the region as will not cause the junction to be forward biased.

Figure 2:
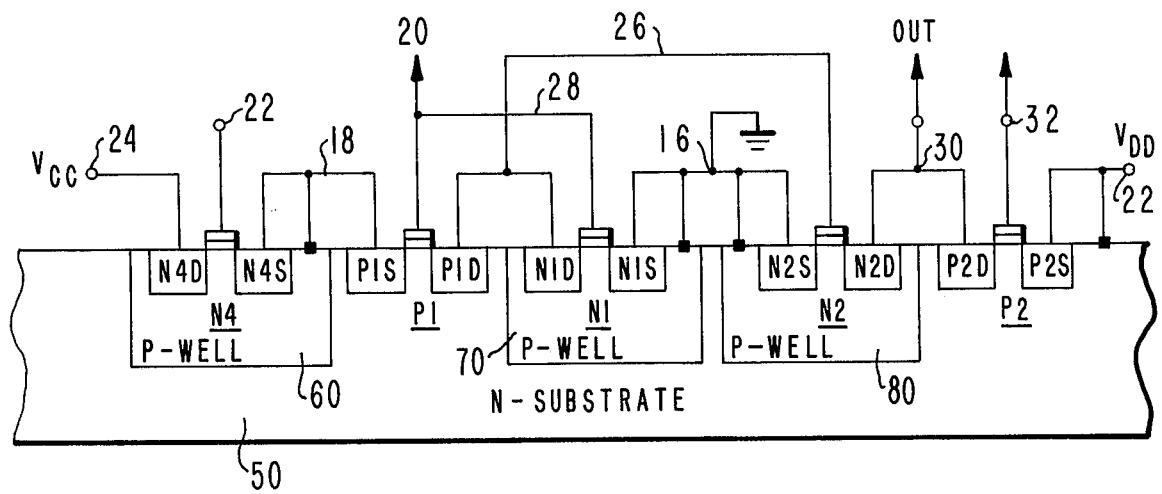

In the accompanying drawings like reference characters denote like components; and FIG. 1 is a schematic diagram of a level shift circuit embodying the invention; and FIG. 2 is a cross section of a portion of the circuit of FIG. 1.

In the FIGURES insulated-gate field-effect transistors (IGFETs) of the enhancement type formed in bulk silicon are used to illustrate the invention. However, it is to be understood that suitable other known types of transistors may be used to practice the invention. Characteristics of enhancement type IGFETs pertinent to the invention are presented below:

1. The transistors used have first and second electrodes, referred to as the source and drain, defining the ends of a conduction path, and a control electrode (gate) whose applied potential determines the conductivity of the conduction path. For a P-type IGFET, the source electrode is defined as that electrode of the first and second electrodes having the higher potential applied thereto. For an N-type IGFET, the source electrode is defined as that electrode of the first and second electrodes having the lower potential applied thereto.

2. For conduction to occur, the applied gate-to-source potential ($V_{GS}$) must be in a direction to enhance conduction and must be greater in amplitude than a minimum value which is defined as the threshold voltage ($V_T$). Thus, where the applied $V_{GS}$ is in a direction to enhance conduction but is lower in amplitude than $V_T$, the transistor remains cut off and there is substantially no current flow in the conduction channel.

In the embodiment of the invention shown in FIGS. 1 and 2, the transistors of P-conductivity type are identified by the letter P followed by a reference numeral and the transistors of N-conductivity type are identified by the letter N followed by a reference numeral.

The circuit of FIG. 1 includes an input section 12, operated between $V_{CC}$ volts and ground and a level shift portion 14 operated between $V_{DD}$ volts and ground. $V_{CC}$ may, typically, lie in the range between 1.5 and 5 volts and $V_{DD}$ may be, typically, in the range between 5 and 15 volts. A first power supply source 7, connected to terminal 22 provides the $V_{DD}$ voltage and a second power supply source 9, connected to terminal 24, provides the $V_{CC}$ voltage.

The input section includes an input complementary inverter 121 comprised of transistors N1 and P1 having their gates connected in common to input terminal 20. The source and substrate 70 of transistor N1 are connected to terminal 16 which is grounded. The drains of transistors N1 and P1 are connected via a conductor 26 to the gate of a transistor N2. The substrate 50 of transistor P1 is at $V_{DD}$ volts and the source of transistor P1 is connected to a conductor 18. Diodes D1S and D1D, shown in phantom view, correspond to the PN junctions formed between the source and drain, respectively, of transistor P1 and the substrate 50. The cathodes of diodes D1S and D1D are an integral part of substrate 50, to which is applied $V_{DD}$ volts, and the anodes of diodes D1S and D1D are an integral part of the source and drain regions, respectively, of transistor P1.

The $V_{CC}$ voltage at terminal 24 is applied to the complementary inverter by means of a control means 122 which includes a transistor N4 whose source and substrate are connected to conductor 18, whose drain is connected to terminal 24, and whose gate is connected via conductor 27 to terminal 22 to which is applied the $V_{DD}$ volts applied to substrate 50. Diode D4D, shown in phantom view, corresponds to the PN junction formed beteeen the drain region and the local substrate 60 of transistor N4.

The level shift portion of the circuit includes transistors N2 and N3. Transistor N3 is connected at its gate via a conductor 28 to input terminal 20. The sources and substrates 80 of transistors N2 and N3 are connected to ground terminal 16. The drain of a transistor P2 and the gate of a transistor P3 are connected to the drain of transistor N2 at output node 30. The drain of transistor P3 and the gate of transistor P2 are connected to the drain of transistor N3 at output node 32. The sources and substrates 50 of transistors P2 and P3 are connected to terminal 22. The voltage swings at the output nodes vary between zero and $V_{DD}$ volts in response to input signals at terminal 20 varying between zero and $V_{CC}$ volts.

The circuit of FIG. 1 may be formed as shown, in part, in FIG. 2. The common substrate 50 is a body of semiconductor of N-conductivity type material in which are diffused regions (60, 70, 80, P1S, P1D, P2S and P2D) of P-conductivity type. P-regions P1D and P1S form the drain and source regions, respectively, of P-conductivity type transistor P1 and P-regions P2D and P2S form the drain and source regions of P-conductivity type transistor P2. The N-conductivity type transistors are formed in P-regions 60, 70 and 80, labelled P-well. N-regions N4S and N4D diffused in P region 60 form the source and drain regions of transistor N4. N-regions N1S and N1D diffused in P-region 70 form the source and drain regions of transistor N1. N-regions N2S and N2D, diffused in P-region 80, form the source and drain regions of transistor N2. Transistor N3, not shown could be formed in the same P-well as transistors N2 or N1.

Overlying the space between the source and drain regions of each transistor is an insulator layer such as silicon dioxide over which is formed a gate electrode. The gates of transistors N1 and P1, are connected in common to input 20. Region N1S is connected to P-region 70 (which is the local substrate of transistor N1) and to ground terminal 16. The drain N1D of transistor N1 is connected to the drain P1D of transistor P1 and to the gate of transistor N2 via conductor 26. The source N4S of transistor N4 is connected to P-region 60 (which is the local substrate of transistor N4) and via conductor 18 to the source P1S of transistor P1. The drain region N4D of transistor N4 is connected to terminal 24 to which is applied $V_{CC}$ volts and the gate electrode of transistor N4 is connected to terminal 22 to which is applied $V_{DD}$ volts. P-region 60 is shown connected to region N4S. However, this connection could be eliminated and P-region 60 could be left floating.

The source N2S of transistor N2 is connected to P-region 80 (which is the local substrate of transistor N2) and to ground terminal 16. The drain N2D of transistor N2 is connected to drain P2D of transistor P2 at node 30 and (not shown) to the gate of transistor P3. The gate of transistor P2 is connected to a node 32 and (not shown) to the drains of transistors P3 and N3. The source P2S of transistor P2 is connected to power contact terminal 22 and to substrate 50 to which is applied the $V_{DD}$ potential.

The sources and substrates of transistors N1, N2 and N3 are connected to ground.

In the circuit of FIGS. 1 and 2, the N-substrate 50 is common to transistors P1, P2 and P3. The N-substrate 50 must be held at, or be near, the most positive voltage applied to the P-conductivity diffused regions to prevent forward conduction through the juntions they form with the substrate. Hence, since the sources of transistors P2 and P3 are operated at $V_{DD}$ volts, the N-substrate 50 must be operated at $V_{DD}$ volts.

The application of the $V_{DD}$ voltage to the substrate of transistor P1 and the application of the $V_{CC}$ voltage which is different than $V_{DD}$, to the source of transistor P1 gives rise to serious problems when $V_{CC}$ is present and is more positive than the $V_{DD}$ applied to the substrate 50. As discussed above, in prior art circuits where $V_{CC}$ is directly applied to the source of transistor P1, serious problems exist for the conditions when $V_{CC}$ is greater than $V_{DD}$ by more than one forward diode drop. This causes diode D1S (and sometimes diode D1D) to conduct large currents in the forward direction. These currents may burn out the diode junctions, damaging the circuit. Also, excessive power and current are drawn from the power supply.

In the circuit of FIGS. 1 and 2, $V_{CC}$ is applied to the source of transistor P1 only when transistor N4 is turned on, and transistor N4 is turned on only when $V_{DD}$ is present. Transistor N4, connected between terminal 24, to which is applied $V_{CC}$ volts, and conductor 18, is responsive to the level of the $V_{DD}$ voltage applied to its gate. Transistor N4 applies to conductor 18 and hence to the source of transistor P1 only that portion of the $V_{CC}$ voltage which is less than the $V_{DD}$ voltage.

Assume first that $V_{CC}$ volts is applied to terminal 24 prior to the application of $V_{DD}$ volts, i.e., $V_{DD}$ is at zero units. Until $V_{DD}$ is applied to the circuit no voltage is applied to the gate of transistor N4. Transistor N4 is then non-conducting and no portion of the $V_{CC}$ volts at terminal 24 is applied to conductor 18. As $V_{DD}$ increases above zero volts, the potential applied to the gate of transistor N4 increases. When $V_{DD}$ reaches $V_T$ volts, transistor N4 turns on assuming that the potential on conductor 18 is at or near zero volts.

For all values of $V_{DD}$ greater than $V_T$ volts and less than $V_{CC} + V_T$ transistor N4 functions as a source follower and applies $V_{DD} - V_T$ volts to conductor 18. For values of $V_{DD}$ equal to or greater than $V_{CC} + V_T$, transistor N4, with $V_{DD}$ applied to its gate and $V_{CC}$ applied to its drain, is overdriven and clamps terminal 24 to conductor 18 causing substantially the full $V_{CC}$ volts to be applied to conductor 18. The voltage at conductor 18 is, thus never more positive than the $V_{DD}$ voltage applied to substrate 50.

Similarly, assume that $V_{CC}$ is present while $V_{DD}$ is being removed. As $V_{DD}$ decreases below $V_{CC} + V_T$ volts, the voltage at conductor 18 equals $V_{DD} - V_T$, whereas the substrate 50 voltage is equal to $V_{DD}$ volts. Thus, the substrate 50 voltage is always more positive than the voltage applied to the source or drain regions of transistor P1. Thus, by means of transistor N4, the voltage at conductor 18 and at the source of transistor P1 is at most equal to $V_{DD} - V_T$ when $V_{DD}$ is less than $V_{CC} + V_T$ and is clamped to $V_{CC}$ volts when $V_{DD}$ exceeds $V_{CC} + V_T$. Consequently, the source drain regions of transistor P1 cannot be operated in the forward conductive mode with respect to the substrate 50.

An examination of FIGS. 1 and 2 indicates that applying a positive voltage ($V_{CC}$) to regions N4D and/or N4S causes the PN junctions at the interface between diffused regions N4D, N4S and substrate 60 to be reverse biased. These junctions are in series with, but poled into a direction opposite to, the PN junction formed between the P-region 60 and N-substrate 50. Thus, back-to-back parasitic diodes are formed between regions N4D, N4S and substrate 50. For all conditions of $V_{CC}$ and $V_{DD}$ (having magnitudes below the junction breakdown) no current (except for leakage) can flow through these parasitic diodes. The drain to substrate diode D4D of transistor N4 is diode isolated from substrate 50 and is reverse biased by the application of $V_{CC}$ volts. The presence or absence of the substrate 50 voltage ($V_{DD}$) has no significant effect on the forward conduction of the source/drain-to-substrate diodes of transistor N4.

That transistor N4 is effectively isolated from N substrate 50 enables the manufacture of a simple element to reliably control the application of the $V_{CC}$ voltage to the source of transistor P1.

The substrate of transistor N4 is shown connected to its source. But, the connection could be omitted and the P-well 60 could be allowed to float.

When the full $V_{DD}$ and $V_{CC}$ volts are applied to terminals 22 and 24, respectively, the circuit functions as a level shifter. The operation of the circuit is described in U.S. Pat. No. 3,801,831 and need not be greatly detailed. Under normal operation, $V_{DD}$ is present, transistor N4 is turned on, and $V_{CC}$ is applied to conductor 18. Transistors P1 and N1 function as a complementary inverter producing at their drains an output signal which is the complement of the input signal applied to terminal 20 connected to their gates. The output of transistors P1 and N1 is applied to the gate of transistor N2 and the input signal is applied to the gate of transistor N3. Transistors N2 and N3 are driven by complementary signals and produce complementary output signals at their drains. Transistors P2 and P3 connected in the drain circuit of transistors N2 and N3 are isolated from the input signal levels. Their gates are cross-coupled and their sources are connected to the $V_{DD}$ voltage. Transistor P2 or P3 when turned on functions to clamp the potential at its drain and at the drain of its associated transistor (N2 or N3) to the $V_{DD}$ voltage. Transistor N2 or N3 when turned on functions to clamp its drain to ground. Therefore, the voltage at the drains of transistors N2/P2, or N3/P3 which define outputs 30 and 32 can swing between $V_{DD}$ volts and ground.

The invention has been illustrated with a level shift circuit. But, clearly, the invention is applicable for any monolithic IC in which one portion is operated at one voltage and a different portion is operated at a different voltage. There need be no relationship between the two portions. That is, signals need not be fed from one portion to the other. The problem has been illustrated with two different power supplies providing the operating voltages to the circuit. However, this problem may also exist when two different voltages applied to a circuit are derived from the same power supply. For some reason (e.g., due to a break in a line), the substrate voltage derived from a single supply may not be present while the different voltage having a polarity to forward bias selected diffused regions is present.

The control element (transistor N4) used to couple $V_{CC}$ is preferably formed on the same substrate as transistors P1, P2 and P3. But, the control element could also be a discrete off-chip component. In such a case, the control element could be any type of switching device controlled by $V_{DD}$.

In FIGS. 1 and 2 the sources and substrates of the transistors of N conductivity type are held at the same voltage. Also, the N-transistors are formed in different P-wells which function as the local substrate of these transistors. However, the invention is also applicable where all the N-transistors would be formed in the same P-region substrate and the sources of some of these N-transistors would be operated at a lower or more negative voltage than the sources of the other N-transistors. The P-region substrate would have to be held at the most negative voltage and a P-type transistor isolated from the P-region substrate could be made and used, in an analogous manner to transistor N4, to control the application of the least negative voltage to the sources of the N transistor to be operated at the lower voltage.

The invention has been illustrated with regions of one conductivity type diffused in a substrate or well of complementary conductivity type. However, the invention is applicable whenever regions of one conductivity are formed in or on a substrate or well of different conductivity type with a diode like junction being formed at the interface.

What is claimed is:
1. An integrated circuit comprising:
   a substrate of first conductivity type;
   first and second regions of second conductivity type in physical contact with said substrate and forming junctions therewith;
   first and second points for the application thereto of first and second, different voltages, respectively;
   means directly connecting said first point to said first region and to said substrate; and
   a control means responsive to said first voltage for coupling said second voltage to said second region only when said first voltage is present; said control means having a conduction path connected between said second point and said second region, and having a control electrode connected to said first point.
2. The integrated circuit as claimed in claim 1 wherein said control means is a transistor having a source and a drain defining the ends of said conduction path and a gate corresponding to said control electrode.
3. The integrated circuit as claimed in claim 2 wherein said source and drain of said transistor include third and fourth spaced apart regions of first conductivity type formed in a fifth region of second conductivity type, said fifth region being formed in physical contact with said substrate; and
   wherein said gate of said transistor is composed of conductive material isolated from, but overlying, the space between said third and fourth regions.
4. The integrated circuit as claimed in claim 3 wherein said first and second regions are diffused in said substrate, where said fifth region is a well region diffused in said substrate, and wherein said third and fourth regions are diffused in said fifth region.
5. The integrated circuit as claimed in claim 4 further including additional regions of said second conductivity type diffused in said substrate;
   one of said additional regions and said first region being spaced apart and forming the source and drain of a first transistor of second conductivity type; another one of said additional regions and said second region being spaced apart and forming the source and drain of a second transistor of second conductivity type; a third transistor of second conductivity type having source and drain regions defining the ends of a conduction path and a control electrode;

means directly connecting the source regions of and first and third transistors of second conductivity type to said first point;

wherein the drain of said control means transistor is connected to said second point; and wherein the source region of said second transistor of second conductivity type is connected to the source of said control means transistor.

6. The integrated circuit as claimed in claim 5 further including additional well regions of said second conductivity type in which are diffused pairs of regions of said first conductivity for forming the sources and drains of additional transistors of said first conductivity type;

a point of reference voltage, other than said first and second points;

means connecting the source regions of said additional transistors of first conductivity type to said point of reference voltage; and means connecting the drain regions of said additional transistors of first conductivity type to different ones of the drains of said transistors of said second conductivity type.

7. The combination as claimed in claim 6 wherein one of said first and second conductivity type is P-conductivity type and the other one of said first and second conductivity type is N-conductivity type; and wherein said transistors are insulated-gate field-effect transistors.

8. The integrated circuit as claimed in claim 4 further including additional regions of said second conductivity type diffused in said substrate;

wherein said first region is the source and one of said additional regions is the drain of a first transistor of second conductivity type;

wherein said second region is the source and another one of said additional regions is the drain of a second transistor of second conductivity type; each one of said first and second transistors having a control electrode;

an input point for the application thereto of input signals;

means for connecting said input point to the control electrode of said second transistor;

a point of reference potential;

means connected between the drains of said first and second transistors and said point of reference voltage; and means connected to the control electrode of said first transistor responsive to the input signal and the signals produced at the drain of said second transistor.

9. The combination as claimed in claim 8 wherein said means connected between the drains of said first and second transistors and said point of reference voltage comprises the source drain paths of first and second additional transistors of first conductivity type connected between the drains of said first and second transistors, respectively, and said point of reference potential:

wherein said means connected to the control electrode of said first transistor includes a third transistor of said second conductivity type and a third additional transistor of said first conductivity type having its conduction path connected between the drain of said third transistor and said point of reference voltage;

wherein each one of said transistors has a control electrode;

means connecting the control electrode of said first transistor to the drain of said third transistor;

means connecting the control electrode of said third transistor to the drain of said first transistor; and means connecting the drain of said second transistor to the control electrode of said first additional transistor of first conductivity type, and means connecting the input signal to the control electrode of said third additional transistor of first conductivity type.

10. In a monolithic integrated circuit formed on a semiconductor substrate having a first portion operated at a first voltage with respect to a reference voltage and a second portion operated at a second voltage with respect to said reference voltage, and where the magnitude of the second voltage is less than that of said first voltage with respect to said reference voltage, the improvement comprising;

means for directly applying said first voltage to said first portion and to the substrate of said integrated circuit; and means responsive to said first voltage connected between a point for the application thereto of said second voltage and said second portion for applying said second voltage to said second portion solely in response to the presence of said first voltage.

11. An integrated circuit comprising:

a substrate of one conductivity type;

a region of opposite conductivity type in physical contact with said substrate and forming a PN junction therewith;

first and second terminals for the application thereto of first and second different operating voltages, respectively;

means connecting said first terminal to said substrate for applying said first operating voltage to said substrate; said first operating voltage having a polarity and magnitude to maintain said PN junction in a reverse bias condition when said second operating voltage is applied to said region;

a control means having a conduction path and a control electrode whose applied potential controls the conductivity of said conduction path; means connecting said conduction path between said second terminal and said region; and means for applying said first operating voltage to said control electrode for coupling said second operating voltage to said region only when said first operating voltage is present.

* * * * *